(12) United States Patent
Kim

(10) Patent No.: US 7,990,061 B2
(45) Date of Patent: Aug. 2, 2011

(54) ORGANIC LIGHT EMITTING DIODE DISPLAY DEVICE

(75) Inventor: Eun-Ah Kim, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 324 days.

(21) Appl. No.: 12/232,814

(22) Filed: Sep. 24, 2008

(65) Prior Publication Data

US 2009/0134782 A1    May 28, 2009

(30) Foreign Application Priority Data

Nov. 27, 2007    (KR) .................. 10-2007-0121476

(51) Int. Cl.
*H01L 51/50* (2006.01)
(52) U.S. Cl. .................. 313/512; 313/504; 313/503
(58) Field of Classification Search .................. 313/503, 313/504, 512; 445/25
See application file for complete search history.

(56) References Cited

U.S. PATENT DOCUMENTS 6,798,132 B2 *    9/2004    Satake .................. 313/495

FOREIGN PATENT DOCUMENTS

| JP | 2002-015862 | 1/2002 |
| JP | 2007-052395 | 3/2007 |
| KR | 1020050050493 | 5/2005 |
| KR | 100722118 | 5/2007 |

\* cited by examiner

*Primary Examiner* — Nimeshkumar D Patel
*Assistant Examiner* — Mary Ellen Bowman
(74) *Attorney, Agent, or Firm* — Robert E. Bushnell, Esq.

(57) ABSTRACT

An organic light emitting diode (OLED) display device according to an exemplary embodiment of the present invention includes a first substrate, a second substrate, a first sealing member, a pad, and a bank. The first substrate includes a light emitting area and a pad area, the second substrate is disposed to opposite to and face to the first substrate, and the first sealing member is disposed between the first substrate and the second substrate to combine the first substrate and the second substrate. The pad is disposed on the pad area, and the bank is formed on the pad area and is spaced apart from the first sealing member.

12 Claims, 8 Drawing Sheets

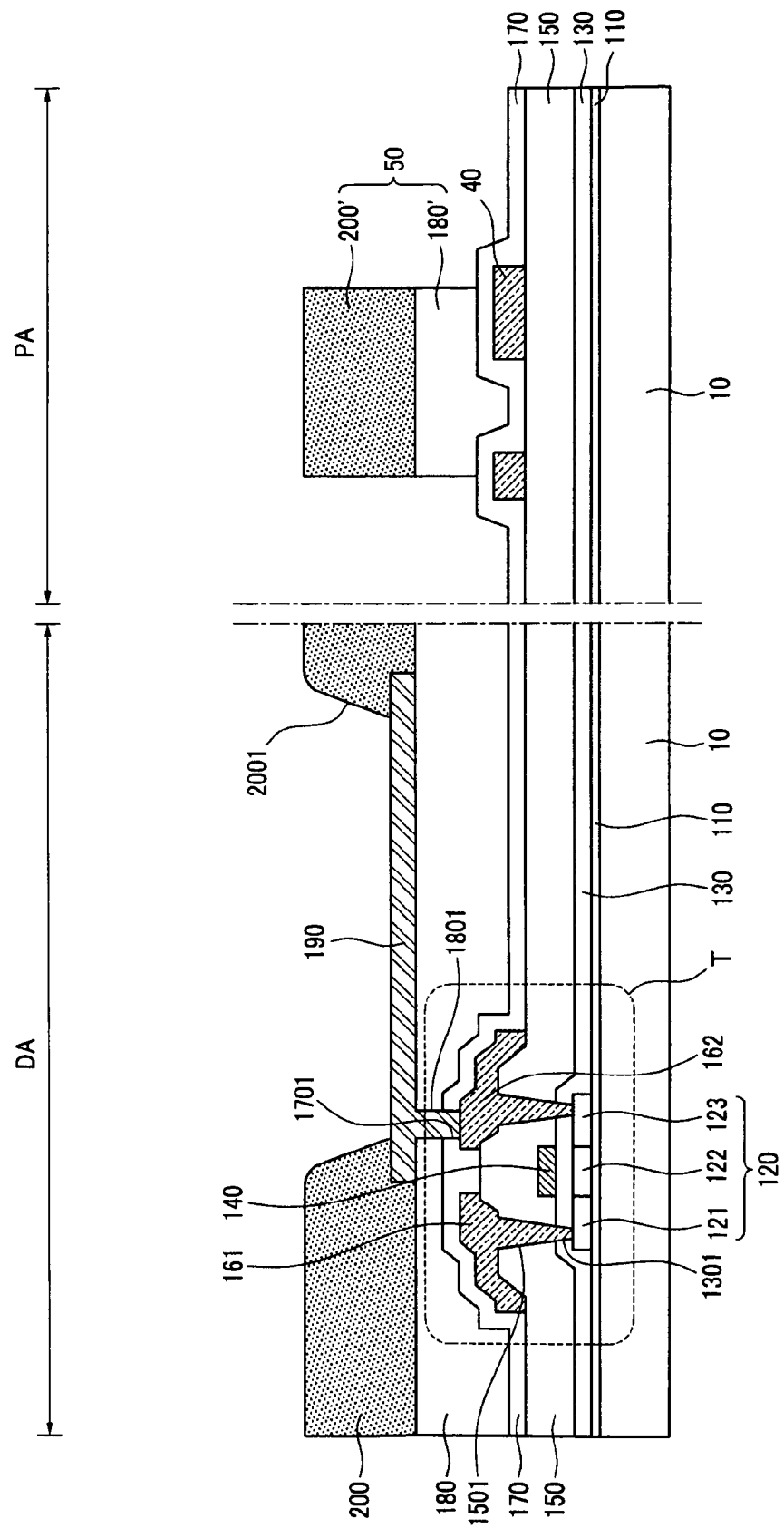

ORGANIC LIGHT EMITTING DIODE DISPLAY DEVICE

CLAIM OF PRIORITY

This application makes reference to, incorporates the same herein, and claims all benefits accruing under 35 U.S.C. §119 from an application for ORGANIC LIGHT EMITTING DIODE DISPLAY earlier filed in the Korean Intellectual Property Office on 27 Nov. 2007 and there duly assigned Serial No. 2007-0121476.

BACKGROUND OF THE INVENTION

1. Field of the Invention

The present invention relates to an organic light emitting diode (OLED) display device, and more particularly, to an optimal pad area of an OLED display device.

2. Description of the Related Art

Among various display panels for a display device, a display panel using an organic light emitting diode (OLED) has been receiving more attention because of the abrupt advance of semiconductor technology.

An active matrix type of OLED display device using an organic light emitting diode includes a plurality of pixels arranged on a substrate formed in a matrix form and thin film transistors (TFTs) disposed at each of the pixels, such that each of the pixels is independently controlled by the thin film transistors.

The OLED display device includes a light emitting area for displaying an image and a non-light emitting area formed on a periphery of the light emitting area, and pads of wires elongated from the light emitting area are provided on the non-light emitting area. Hereinafter, for convenience of description, a part where the pads are provided will be referred to as a pad area.

Contemporarily, a substrate on which a thin film transistor, an organic light emitting element, and a wire pattern are formed is provided, and an encapsulation substrate is sealed thereto to form the OLED display device. Here, after the substrate and the encapsulation substrate are sealed together, the area of the encapsulation substrate corresponding to the pad area is partially eliminated in order to expose the plurality of pads through the substrate. A thermal compression method is used to electrically connect the pads to a connection element (e.g., a flexible printed circuit board (FPCB)) for electrically connecting the OLED display device to an external device.

In a process for partially eliminating the encapsulation substrate, however, stress is applied to the substrate provided under the encapsulation substrate by the eliminating force, and the thin film transistor, organic light emitting element, and wire patterns formed on the substrate may be damaged.

When the elements on the substrate are damaged, a pixel error in the OLED display device may occur, and quality of the product may be deteriorated.

The above disclosed information in this Background section is only for enhancement for understanding the background of the invention and therefore it may contain information that does not form the prior art that is already known in this country to a person of ordinary skill in the art.

SUMMARY OF THE INVENTION

It is therefore one object of the present invention to provide an improved organic light emitting diode display device in order to prevent the damage of the substrate induced by partially eliminating the substrate.

It is another object of the present invention to provide an organic light emitting diode (OLED) display device for minimizing stress applied to a substrate in a severing process for exposing a pad on the substrate in order to prevent damage to constituent elements formed on the substrate.

An organic light emitting diode (OLED) display device according to an exemplary embodiment of the present invention includes a first substrate, a second substrate, a first sealing member, a pad, and a bank. The first substrate includes a light emitting area and a pad area, and the second substrate is arranged opposite to the first substrate. The first sealing member is disposed between the first substrate and the second substrate in order to connect the first substrate and the second substrate, the pad is disposed in the pad area, and the bank is formed on the pad area in order to be separated from the first sealing member.

Here, the bank and the pad may be overlapped with each other, and the bank may be formed on the pad.

In addition, the bank may be formed in a bar shape.

The OLED display device may further include a second sealing member neighboring the first sealing member to be formed between the first substrate and the second substrate. In this case, the second sealing member may be formed between the first sealing member and the bank neighboring the first sealing member at a pad area side of the first substrate. In addition, the second sealing member may physically contact the first substrate, the second substrate, the first sealing member, and the bank neighboring the first sealing member, and the bank may be partially contained within the second sealing member. A gap between the first sealing member and the bank may be narrower than a gap between the second substrate and the bank.

The OLED display device may further include a thin film transistor, a planarization layer, an organic light emitting element, and a pixel defining layer. The thin film transistor is formed on the first substrate. The planarization layer is formed on the first substrate in order to cover the thin film transistor, the organic light emitting element is electrically connected to the thin film transistor and is formed on the thin film transistor, and the pixel defining layer is formed on the planarization layer to pattern the organic light emitting element.

Since the OLED display device according to the exemplary embodiment of the present invention includes the bank formed on the substrate, the OLED display device may reduce stress applied to the substrate in a process for scribing an encapsulation substrate. Therefore, damage to constituent elements formed on the substrate may be prevented in the scribing process, and reliability of the OLED display device may be increased.

In addition, since a configuration of the bank is optimized and a sealing agent coated between the substrate and the encapsulation substrate may be easily provided after the scribing process, no empty space is provided between the substrate and the encapsulation substrate. Therefore, a display device having excellent durability may be manufactured.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIG. 6A to FIG. 6D are cross-sectional views cut along line VI-VI' as shown in FIG. 1 representing in order a manufacturing process of the OLED display device as shown in FIG. 1.

DETAILED DESCRIPTION OF THE INVENTION

Figure 1:
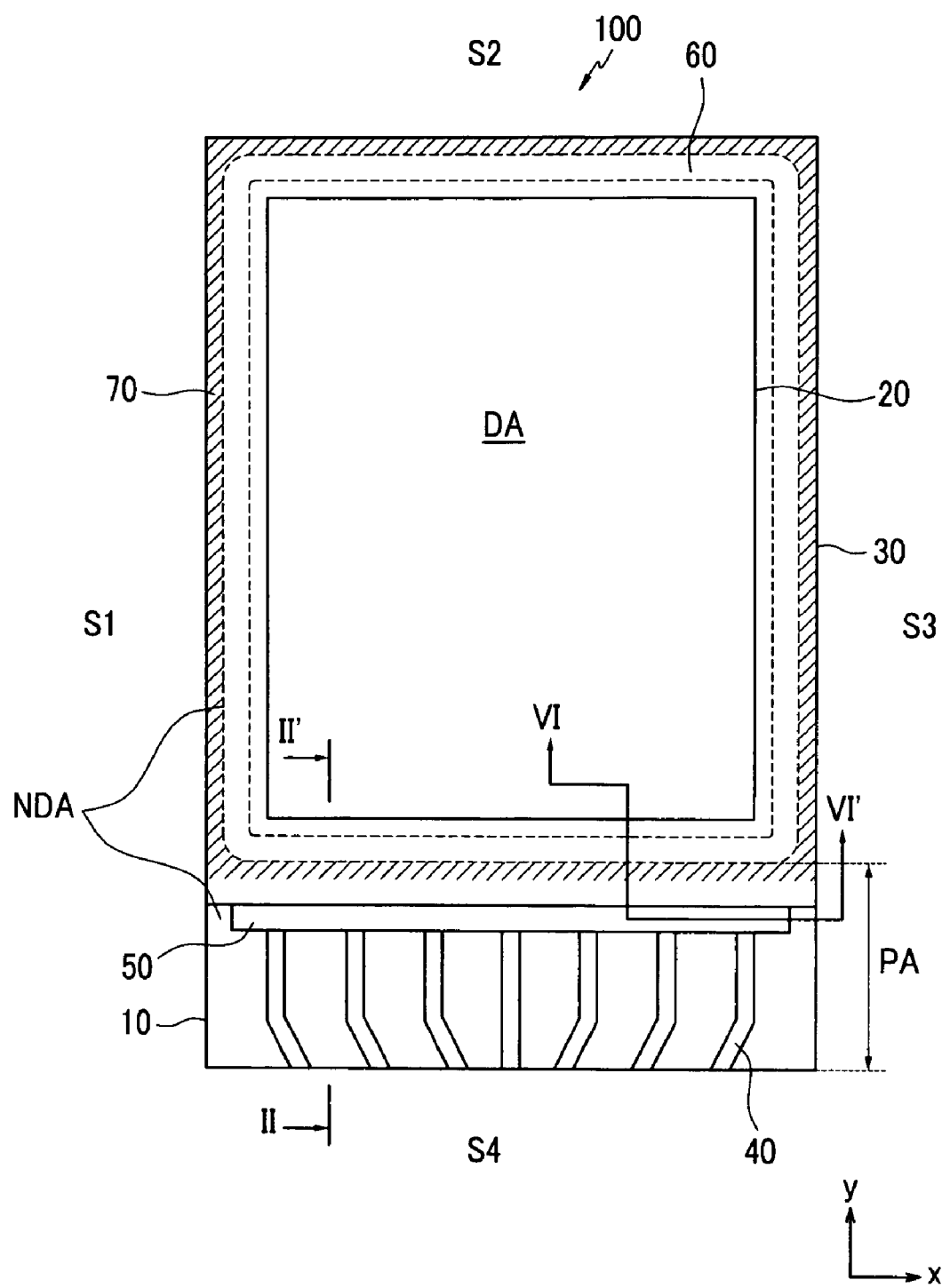
FIG. 1 is a top plan view of an organic light emitting diode (OLED) display device constructed as an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Accordingly, the drawings and description are to be regarded as illustrative in nature and not restrictive. Like reference numerals designate like elements throughout the specification.

In the drawings, the thickness of layers, films, panels, regions, etc., are exaggerated for clarity. It will be understood that when an element such as a layer, film, region, or substrate is referred to as being "on" another element, it may be directly on the other element or intervening elements may also be presented in between. In contrast, when an element is referred to as being "directly on" another element, there are no intervening elements present.

Throughout this specification and the claims that follow, when it is described that an element is "coupled" to another element, the element may be "directly coupled" to another element or "electrically coupled" to another element through a third element. In addition, unless explicitly described to the contrary, the word "comprise" and variations such as "comprises" or "comprising" will be understood to imply the inclusion of stated elements but not the exclusion of any other elements.

FIG. 1 is a top plan view of an organic light emitting diode (OLED) display device 100 constructed as an exemplary embodiment of the present invention.

Referring to FIG. 1, OLED display device 100 includes a first substrate 10 (hereinafter referred to as a "substrate"), a light emitting unit 20, and a second substrate 30 (hereinafter referred to as an "encapsulation substrate").

Substrate 10 may be made of an electrically insulating material or a metallic material. Glass or plastic may be used as the electrically insulating material. Stainless using steel (SUS) may be used as the metallic material.

First substrate 10 includes a light emitting area DA for emitting light and a non-light emitting area NDA disposed at the periphery of the light emitting area DA. If OLED display device 100 has an active matrix structure, the light emitting area DA includes a plurality of organic light emitting diodes and thin film transistors for driving the organic light emitting diodes. The non-light emitting area NDA includes wire patterns 40 that are elongated from scan lines or data lines (not shown) that are formed at the light emitting area DA.

Bank 50 is formed on pad area PA. Bank 50 is provided separately from a first sealing member 60 sealing substrate 10 and encapsulation substrate 30 together, and bank 50 is formed in pad area PA. Bank 50 and pad 40 may be overlapped with each other in pad area PA. Bank 50 may be formed of at least one material among materials forming light emitting unit 20, which will be described later.

In the exemplary embodiment of the present invention, bank 50 is formed on pad 40 in a bar shape extending along the shorter edge of substrate 10 (i.e., an x-axis direction). A shape of bank 50 may be variously formed when bank 50 is overlapped with pad 40.

Encapsulation substrate 30 is disposed to opposite to and face to substrate 10, and substrate 10 and encapsulation substrate 30 are combined and sealed together by first sealing member 60 provided along edges of substrate 10 and encapsulation substrate 30. Therefore, encapsulation substrate 30 seals light emitting unit 20 formed on substrate 10. Encapsulation substrate 30 may be formed of a transparent glass.

Further, a second sealing member 70 is disposed embracing first sealing member 60 between substrate 10 and encapsulation substrate 30. Second sealing member 70 may be used as a reinforcement member for more tightly combining substrate 10 and encapsulation substrate 30.

Figure 2:
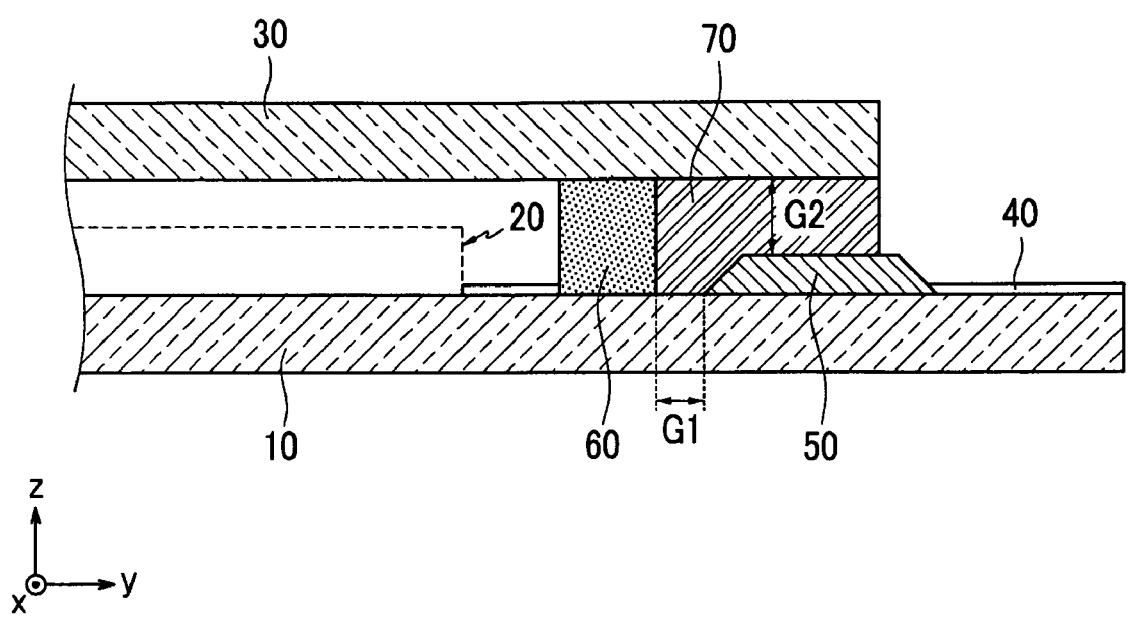
FIG. 2 is a cross-sectional view cut along line II-II' as shown in FIG. 1.

FIG. 2 is a cross-sectional view cut along line II-II' as shown in FIG. 1.

Referring to FIG. 2, bank 50 is formed on pad 40 to cover pad 40, and bank 50 is partially contained within second sealing member 70, and is partially exposed on substrate 10. Here, bank 50 is formed on substrate 10 such that gap G1 formed between bank 50 and first sealing member 60 is narrower than a gap G2 between bank 50 and encapsulation substrate 30.

Figure 3:
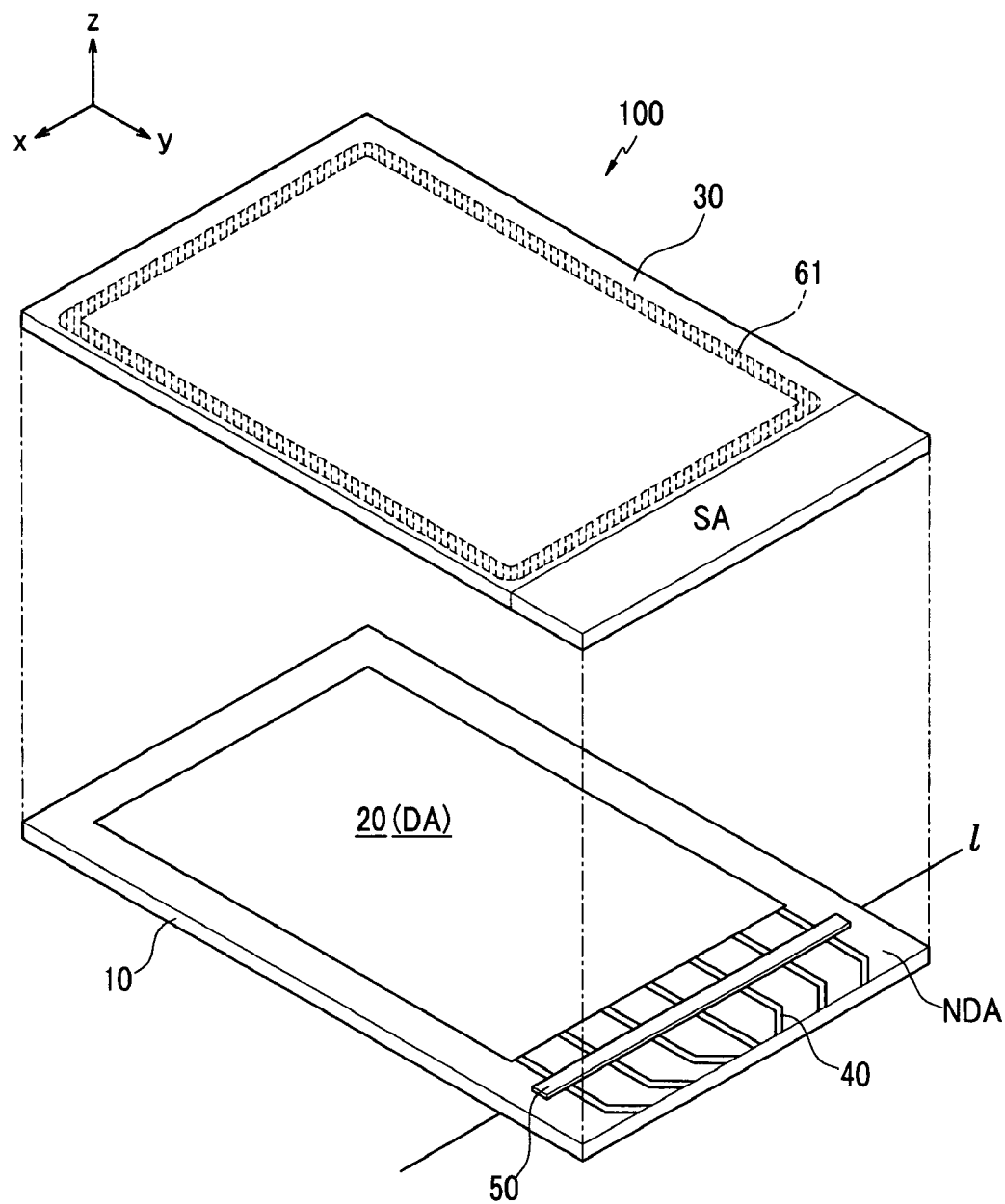
FIG. 3 to FIG. 5 are diagrams illustrating a process for combining the substrate and the encapsulation substrate in the OLED display device constructed as the exemplary embodiment of the present invention.
Figure 4:
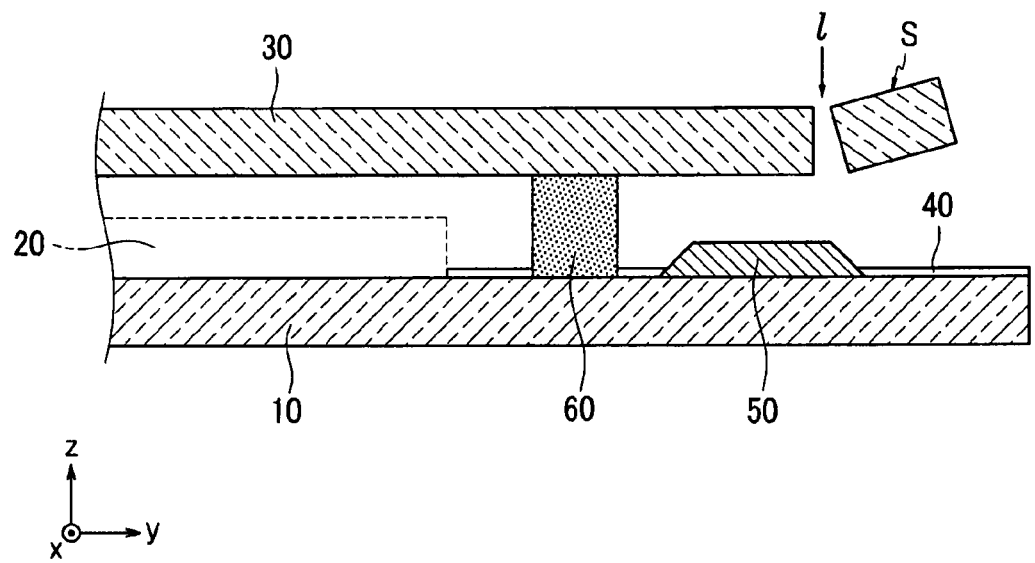
Figure 5:
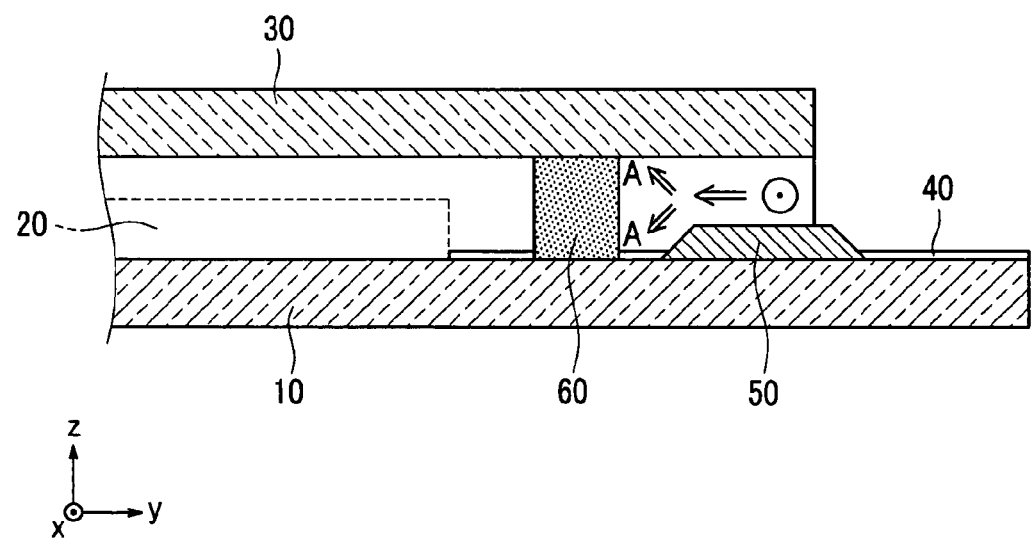

FIG. 3 to FIG. 5 are diagrams representing procedural steps of combining substrate 10 and encapsulation substrate 30 in OLED display device 100 constructed as the exemplary embodiment of the present invention.

Referring to FIG. 3, substrate 10 having light emitting area DA where light emitting unit 20 is formed by a predetermined process, and encapsulation substrate 30 on which frit 61 disposed for first sealing member 60 is coated, are prepared. In this case, encapsulation substrate 30 has a size corresponding to the size of substrate 10. That is, encapsulation substrate 30 includes severance area SA corresponding to pad area PA of substrate 10.

Since pad 40 formed on pad area PA of substrate 10 may not be exposed to the exterior when encapsulation substrate 30 is combined to substrate 10, a severing process for generating severance area SA of encapsulation substrate 30 is performed after substrate 10 and encapsulation substrate 30 are combined by first sealing member 60 in order to expose pad area PA to the exterior, as shown in FIG. 4.

Pad 40 formed on substrate 10 may be exposed to the exterior by the severing process, and a driver integrated circuit or a flexible printed circuit (FPC) is electrically connected to pad 40 by a process subsequent to the severing process.

In order to perform the severing process, encapsulation substrate 30 is firstly scribed by using a diamond wheel or a laser, and then a breaking process for separating the scribed severance area SA is performed. In this case, a stress is applied to substrate 10, and pad 40 of substrate 10 may be damaged.

Bank 50 is formed on substrate 10 in order to prevent the damage so that the stress applied to substrate 10 may be absorbed. That is, since bank 50 may absorb the stress applied to substrate 10 when the breaking process for partially eliminating encapsulation substrate 30 along cutting line 1 is performed, constituent elements including pad 40 formed on substrate 10 may not be damaged.

Subsequently, a forming process of second sealing member 70 is performed. A material (e.g., epoxy, acryl, and urethane) forming second sealing member 70 is coated between substrate 10 and encapsulation substrate 30 at three sides (i.e., S1, S2, and S3, as shown in FIG. 1) of substrate 10, but is not coated at a pad area PA side (i.e., S4 as shown in FIG. 1) of substrate 10, to form second sealing member 70.

Here, the material forming second sealing member 70 coated on sides S1 and S3 is provided between substrate 10 and encapsulation substrate 30 at side S4 between encapsulation substrate 30, bank 50, and first sealing member 60.

In this case, since a location condition (gap G1<gap G2 as show in FIG. 2) of bank 50 with respect to first sealing member 60 and encapsulation substrate 30 is established such that gap G1 between bank 50 and first sealing member 60 is narrower than gap G2 between bank 50 and encapsulation substrate 30, the material forming second sealing member 70 may be easily provided to the gap between first sealing member 60 and bank 50 by a capillary effect where the material forming second sealing member 70 is provided from sides S1 and S3 to side S4 (refer to arrows A shown in FIG. 5).

Accordingly, the material for second sealing member 70 may efficiently fill between substrate 10 and encapsulation substrate 30 at side S4, and second sealing member 70 may be appropriately formed in the four sides of substrate 10 and encapsulation substrate 30. A method for forming bank 50 according to the exemplary embodiment of the present invention by using the same material as that of the light emitting unit will now be described.

FIG. 6A to FIG. 6D are cross-sectional views along line VI-VI' as shown in FIG. 1 representing a manufacturing process in order while partially enlarging light emitting area DA and pad area PA shown in FIG. 1.

Figure 6A:
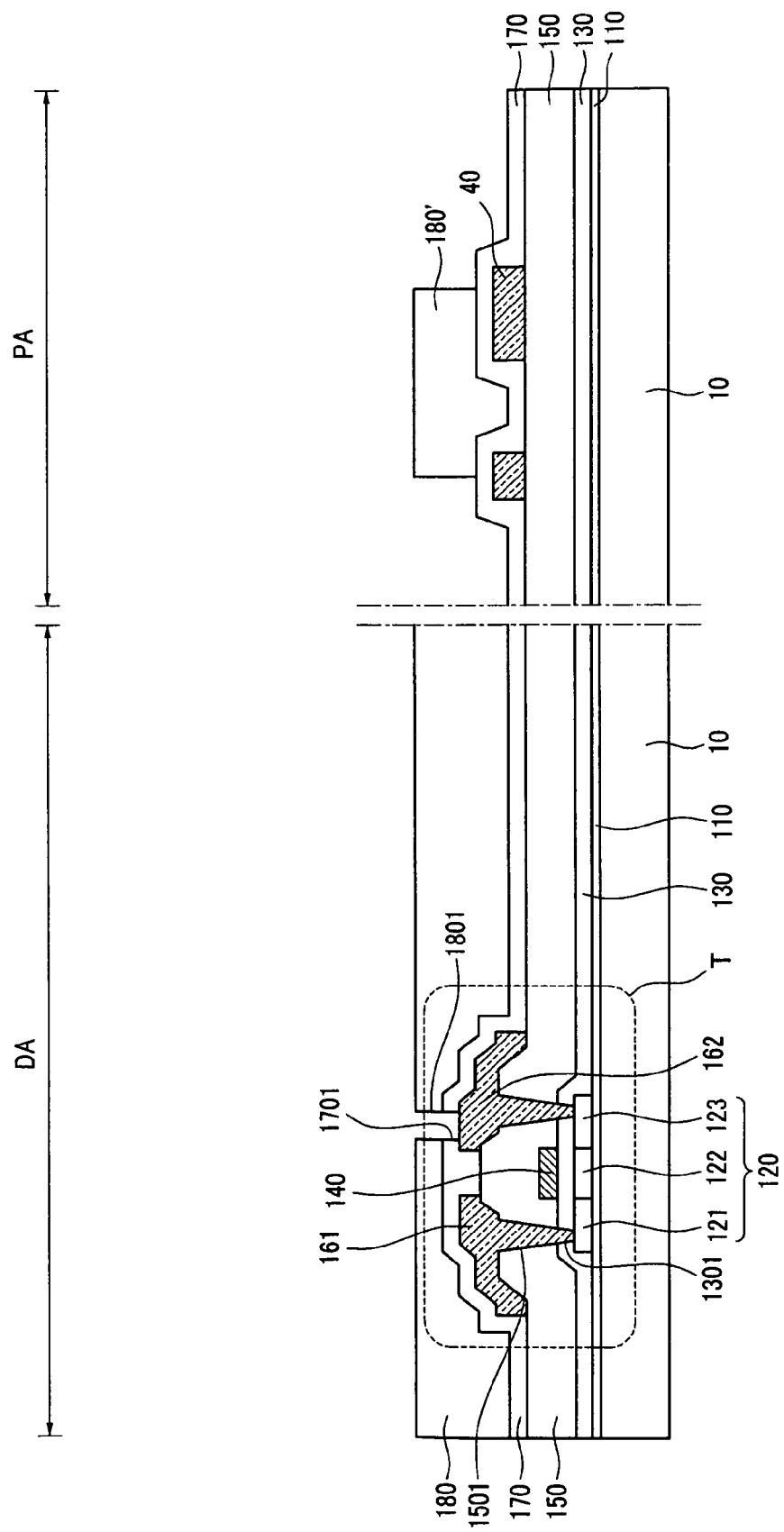

Referring to FIG. 6A, a buffer layer 110 is formed on substrate 10 including light emitting area DA and pad area PA. Buffer layer 110 prevents spread of impurities of substrate 10 when an active layer 120 is formed. For example, buffer layer 110 may be formed of a silicon nitride layer or a stacked layer of silicon nitride and silicon oxide.

A thin film transistor T is formed on buffer layer 110 in the light emitting area DA of substrate 10. Thin film transistor T includes active layer 120 formed on buffer layer 110, a source electrode 161, a drain electrode 162, and a gate electrode 140. Here, active layer 120 includes a source area 121, a drain area 123, and a channel area 122 for connecting source area 121 and drain area 123.

A gate insulating layer 130 is formed on buffer layer 110 of pad area PA and light emitting area DA while covering active layer 120, and a gate electrode 140 is formed on active layer 120 in light emitting area DA while having gate insulating layer 130 between gate electrode 140 and active layer 120. Here, gate electrode 140 may be made of one selected from a group consisting of, for example, MoW, Al, Cr, and Al/Cr. Source electrode 161 and drain electrode 162 may be made of metal, for example Ti/Al or Ti/Al/Ti.

An interlayer insulating layer 150 is formed on gate insulating layer 130 of light emitting area DA and pad area PA while covering gate electrode 140.

Here, a first contact hole 1301 and a second contact hole 1501 are respectively formed on gate insulating layer 130 and interlayer insulating layer 150 of light emitting area DA. Therefore, since source area 121 and drain area 123 are exposed through first contact hole 1301 and second contact hole 1501, source electrode 161 and drain electrode 162 are respectively connected to the exposed source and drain areas 121 and 123. In this case, pad 40 formed of the same material as source electrode 161 and drain electrode 162 is formed on interlayer insulating layer 150 of pad area PA.

In addition, a passivation layer 170 and a planarization layer 180 of light emitting area DA are sequentially formed on interlayer insulating layer 150 of light emitting area DA and pad area PA while covering thin film transistor T.

Here, first via hole 1701 and second via hole 1801 for partially exposing drain electrode 162 are formed in passivation layer 170 and planarization layer 180 of the light emitting area DA. In this case, planarization layer 180' of pad area PA may be patterned to be a predetermined shape in exposing and developing processes.

Figure 6B:
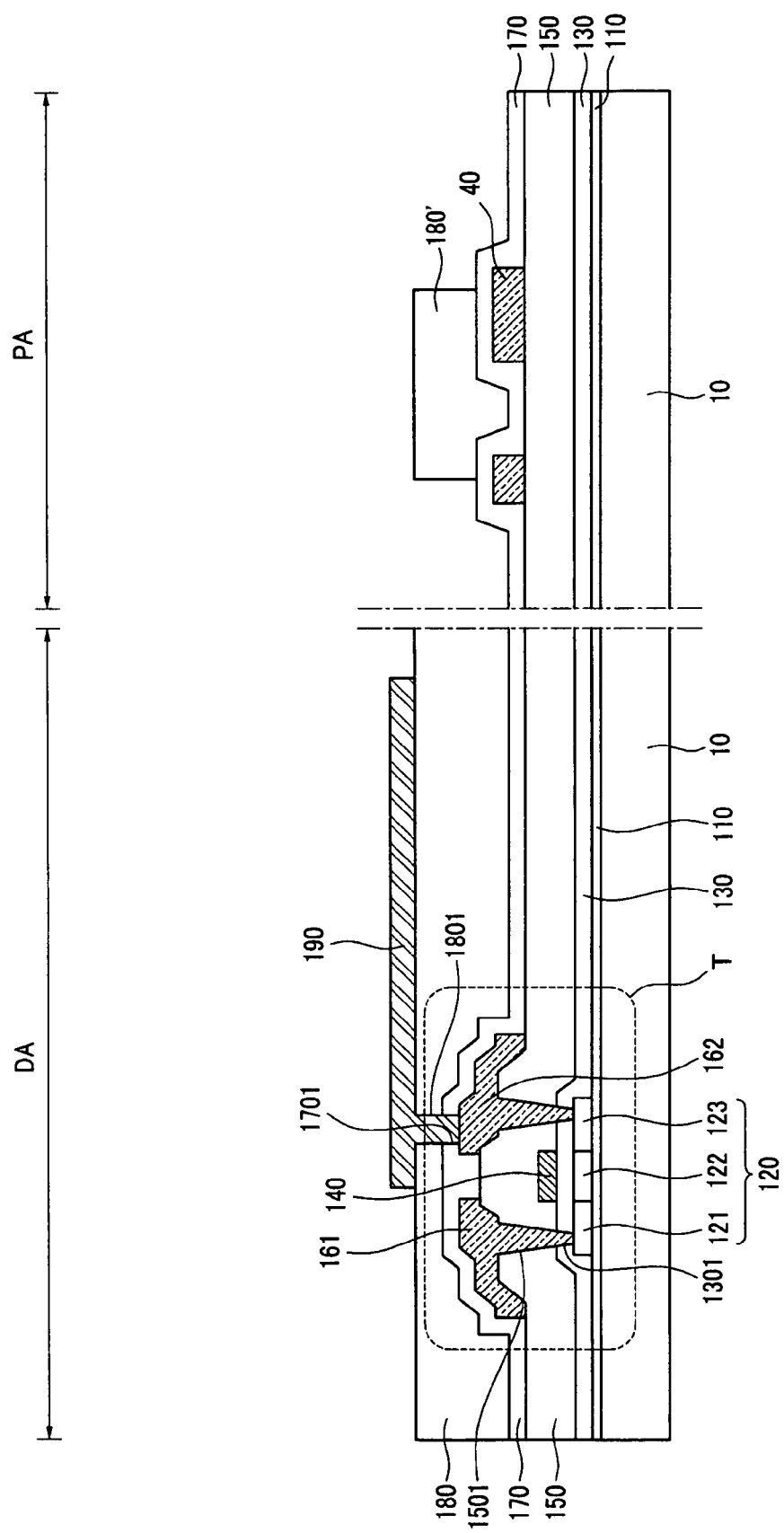

Referring to FIG. 6B, first pixel electrode 190 is formed on planarization layer 180 of light emitting area DA, and drain electrode 162 of thin film transistor T is electrically connected to first pixel electrode 190 through via hole 1801.

Referring to FIG. 6C, a pixel defining layer 200 is formed on planarization layer 180 of light emitting area DA in order to electrically insulate first pixel electrode 190 from a first pixel electrode (not shown) of the neighboring pixels. An opening 2001 for partially exposing first pixel electrode 190 is formed in pixel defining layer 200. In this case, a pixel defining layer 200' patterned in the same shape as planarization layer 180' may be formed on pad area PA in the contemporary exposing and developing processes. Planarization layer 180' and pixel defining layer 200' form bank 50 of pad area PA. In the exemplary embodiment of the present invention, it has been described that bank 50 is formed of the same material as planarization layer 180 of light emitting area DA and pixel defining layer 200, but is not limited thereto. For example, when a spacer (not shown) is provided in a part of the light emitting area, bank 50 may include the same material as the spacer.

Figure 6D:
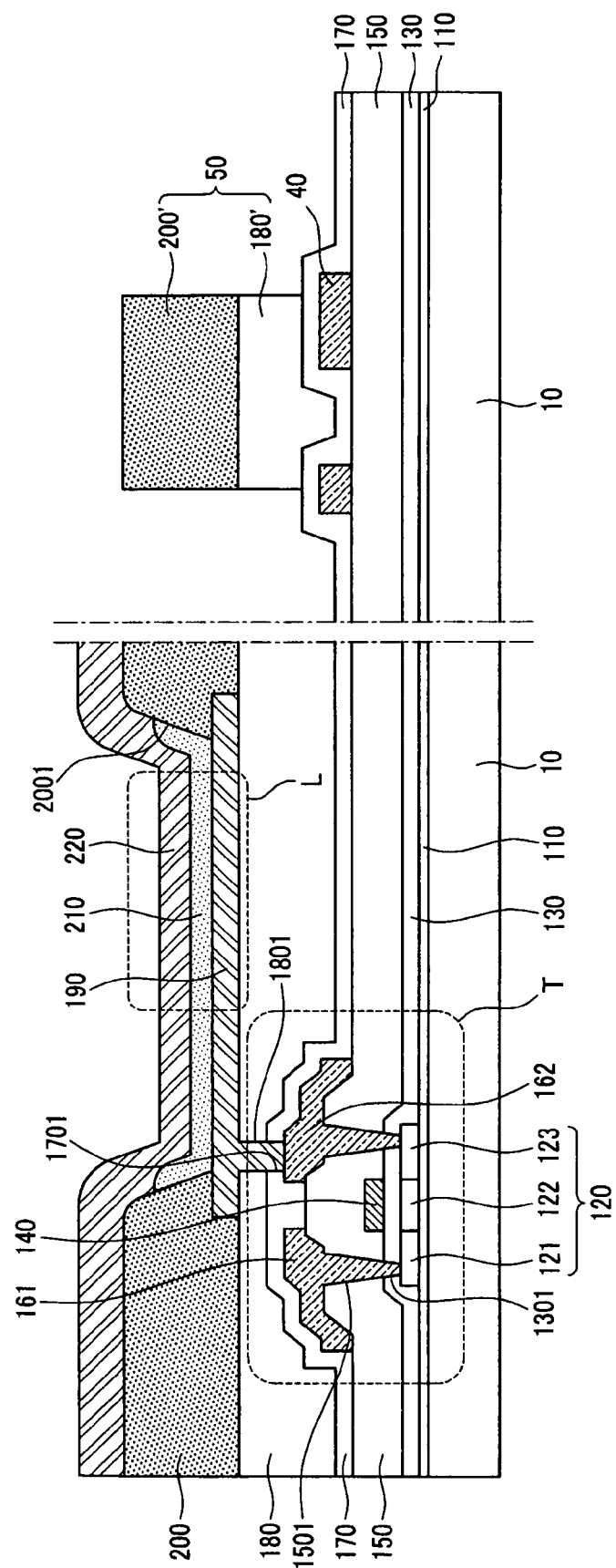

Referring to FIG. 6D, organic emission layer 210 is formed on first pixel electrode 190 through opening 2001 of the light emitting area DA, and second pixel electrode 220 is formed to cover the entire surface of light emitting area DA. Therefore, first pixel electrode 190, organic emission layer 210, and second pixel electrode 220 are sequentially formed to form an organic light emitting element L.

While the present invention has been described in connection with what is presently considered to be practical exemplary embodiments, it is to be understood that the present invention is not limited to the disclosed embodiments, but, on the contrary, is intended to cover various modifications and equivalent arrangements included within the spirit and scope of the appended claims.

What is claimed is:

1. An organic light emitting diode (OLED) display device, comprising:
    a first substrate comprising a light emitting area and a pad area;
    a second substrate disposed opposite to and to face to the first substrate;
    a first sealing member disposed between the first substrate and the second substrate to physically couple the first substrate and the second substrate;
    a second sealing member neighboring to the first sealing member, the second sealing member being disposed between the first substrate and the second substrate, and the second sealing member being in immediate physical contact with the first sealing member;
    a pad disposed on the pad area; and
    a bank formed on the pad area and spaced apart from the first sealing member.

2. The OLED display device of claim 1, in which the bank and the pad are overlapped with each other.

3. The OLED display device of claim 1, in which the bank is formed on the pad.

4. The OLED display device of claim 1, in which the bank is formed in a bar shape.

5. The OLED display device of claim 1, in which the second sealing member is formed between the first sealing member and the bank, and the second sealing member is neighboring a part of the first sealing member, and the part of the first sealing member is formed at a side of the first substrate with the side of the first substrate being disposed at the pad area.

6. The OLED display device of claim 1, in which the second sealing member physically contacts the first substrate, the second substrate, and the bank disposed near to the first sealing member.

7. The OLED display device of claim 6, in which the bank is partially covered by the second sealing member.

8. The OLED display device of claim 1, in which a gap formed between the first sealing member and the bank is narrower than a gap formed between the second substrate and the bank.

9. The OLED display device of claim 1, further comprising:
   a thin film transistor formed on the first substrate;
   a planarization layer formed on the first substrate to cover the thin film transistor;
   an organic light emitting element electrically connected to the thin film transistor, and formed on the thin film transistor;
   a pixel defining layer formed on the planarization layer to pattern the organic light emitting element; and
   the bank comprising at least one material forming the planarization layer and the pixel defining layer.

10. An organic light emitting diode (OLED) display device, comprising:
    a first substrate comprising a light emitting area and a pad area partially exposed to an exterior of the OLED display device;
    a second substrate having smaller area compared to the first substrate being disposed to opposite to and facing the first substrate;
    a first sealing member disposed between the first and second substrates to physically couple the first and second substrates and seal peripheries of both of the first and second substrates;
    a pad disposed on the pad area and exposed to the exterior of the OLED display device; and
    a bank disposed on the pad area, the bank being spaced apart from the first sealing member by a second sealing member physically contacted with the first sealing member and the bank being disposed between the first and second substrates.

11. The OLED of claim 10, with the bank being partially covered by the second sealing member.

12. The OLED display device of claim 10, in which a gap formed between the first sealing member and the bank is narrower than a gap formed between the second substrate and the bank.

* * * * *